United States Patent
Chapman et al.

(10) Patent No.: US 7,498,622 B1
(45) Date of Patent: Mar. 3, 2009

(54) LATCHUP ROBUST GATE ARRAY USING THROUGH WAFER VIA

(75) Inventors: Phillip Francis Chapman, Colchester, VT (US); David S. Collins, Williston, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/956,417

(22) Filed: Dec. 14, 2007

(51) Int. Cl.
*H01L 31/112* (2006.01)
(52) U.S. Cl. .................. 257/276; 438/122; 438/620
(58) Field of Classification Search .................. 257/276
See application file for complete search history.

(56) References Cited

U.S. PATENT DOCUMENTS

| 6,355,950 | B1 * | 3/2002 | Livengood et al. | 257/276 |
| 6,984,855 | B2 * | 1/2006 | Okada | 257/274 |
| 7,075,133 | B1 * | 7/2006 | Padmanabhan et al. | 257/276 |

* cited by examiner

*Primary Examiner*—N Drew Richards
*Assistant Examiner*—Mamadou Diallo
(74) *Attorney, Agent, or Firm*—Schmieser, Olsen & Watts; W. Riyon Harding

(57) ABSTRACT

A structure and a method for preventing latchup in a gate array. The structure including: a NFET gate array and a PFET gate array in a substrate; an electrically conductive through via extending from a bottom surface of the substrate toward a top surface of the substrate the NFET gate array and PFET gate array, the through via electrically contacting the P-well.

14 Claims, 3 Drawing Sheets

LATCHUP ROBUST GATE ARRAY USING THROUGH WAFER VIA

FIELD OF THE INVENTION

The present invention relates to the field of integrated circuits; more specifically, it relates to gate array structures and method of making gate arrays latchup robust.

BACKGROUND OF THE INVENTION

In modern integrated circuits, gate arrays comprising p-channel field effect transistors (PFETs) and n-channel field effect transistors (NFETs) can be susceptible to latchup. Latch-up causes Metal-Oxide-Silicon FETs (MOSFETs) to consume large amounts of current overheating and destroying the integrated circuit in which latchup occurs. Existing methods for reducing this propensity to complementary MOS (CMOS) latchup have become increasingly less effective as doping levels of the substrates of integrated circuits have decreased. Therefore there is a need in the industry for more robust latchup preventive structures and methods for preventing latchup for gate arrays in integrated circuit chips.

SUMMARY OF THE INVENTION

A first aspect of the present invention is a structure, comprising: a P-well and an N-well formed in a semiconductor substrate, the P-well extending from a top surface of the substrate into the substrate a first distance, the N-well extending from the top surface of the substrate into the substrate a second distance; dielectric isolation extending from the top surface of the substrate into the substrate a third distance, the first, second and third distances less than a whole distance between the top and bottom surfaces of the substrate, the first and second distances greater than the third distances, the P-well abutting a bottom surface of the dielectric isolation and the N-well abutting the bottom surface of the dielectric isolation where the dielectric isolation extends into the N-well and the P-well; an array of spaced apart first gate electrodes positioned over the P-well, a first set of source/drains formed in the P-well between the first gate electrodes; an array of spaced apart second gate electrodes positioned over the N-well, a set of second source/drains formed in the N-well between the second gate electrodes; and an electrically conductive through via extending from the bottom surface of the substrate into the substrate a fourth distance, the fourth distance less than the whole distance, the through via contacting the P-well and abutting the bottom surface of shallow trench isolation that extends into the P-well.

A second aspect of the present invention is a method, comprising: forming a P-well and an N-well in a semiconductor substrate, the P-well extending from a top surface of the substrate into the substrate a first distance, the N-well extending from the top surface of the substrate into the substrate a second distance; forming dielectric isolation in the substrate, the dielectric isolation extending from the top surface of the substrate into the substrate a third distance, the first, second and third distances less than a whole distance between the top and bottom surfaces of the substrate, the first and second distances greater than the third distances, the P-well abutting a bottom surface of the dielectric isolation and the N-well abutting the bottom surface of the dielectric isolation where the dielectric isolation extends into the N-well and the P-well; forming an array of spaced apart first gate electrodes positioned over the P-well, a first set of source/drains formed in the P-well between the first gate electrodes; forming an array of spaced apart second gate electrodes positioned over the N-well, a set of second source/drains formed in the N-well between the second gate electrodes; and forming an electrically conductive through via extending from the bottom surface of the substrate into the substrate a fourth distance, the fourth distance less than the whole distance, the through via contacting the P-well and abutting the bottom surface of shallow trench isolation that extends into the P-well.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Latchup is defined as the triggering of a parasitic structure which then acts as a short circuit creating a low impedence path between the power supply rails and an electrical component.

Figure 1:
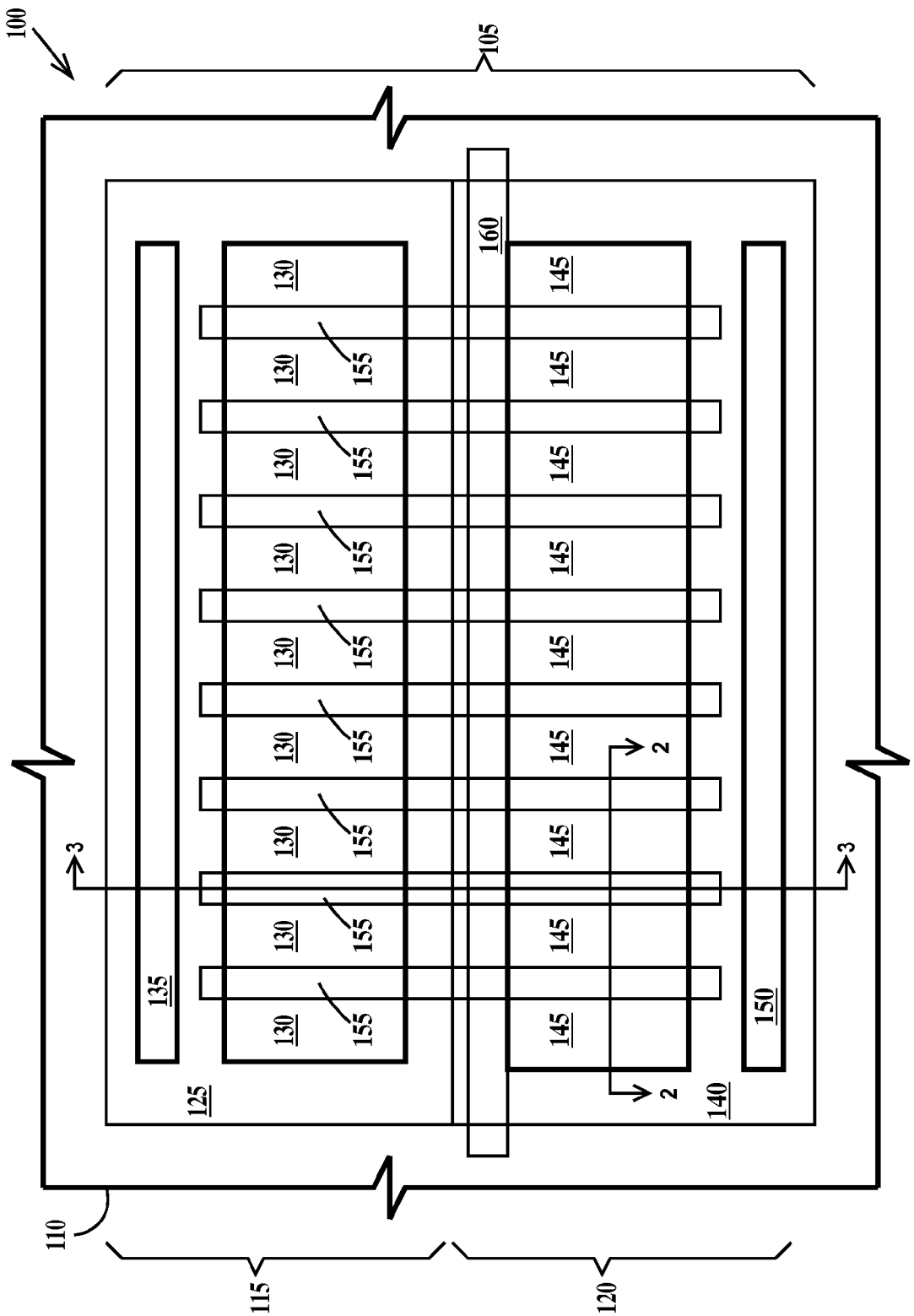
FIG. 1 is a plan view of an gate array according to embodiments of the present invention.

FIG. 1 is a plan view of a gate array according to embodiments of the present invention. In FIG. 1, formed in a substrate 100 is a gate array 105. Gate array 105 is surrounded by shallow trench isolation (STI) 110 (heavy lines). Gate array 105 includes a PFET gate array 115 and an NFET gate array 120. It should be understood that a "gate array" includes at least one PFET device, and one NFET device, whereas a "PFET gate array" includes one or more PFET devices, and whereas a "NFET gate array" includes at least one or more NFET devices, where spatially the PFET device or gate array and the NFET device or gate array are in proximate to each other. PFET gate array 115 includes an N-well 125, source drains 130 formed in the N-well and an N-well contact 135 to the N-well. NFET gate array 120 includes a P-well 140, source drains 145 formed in the P-well and a P-well contact 150 to the P-well. An array of gate electrodes 155 is common to both PFET gate array 115 and NFET gate array 120. When substrate 100 is P-type, P-well contact 150 is also a substrate contact. It should be noted that N-well contact 135 and P-well contact 150 on located on opposing sides of gate array 105 to allow compact layout of gate electrodes 155. An electrically conductive through via 160 contacts P-well 140 and STI 110 (see FIG. 3 and description infra).

Alternatively, a first array of gates may be positioned over N-well 125 and a second array of gates, not physically attached to the first array of gates, may be positioned over P-well 140, instead of common gates 155.

Figure 2:
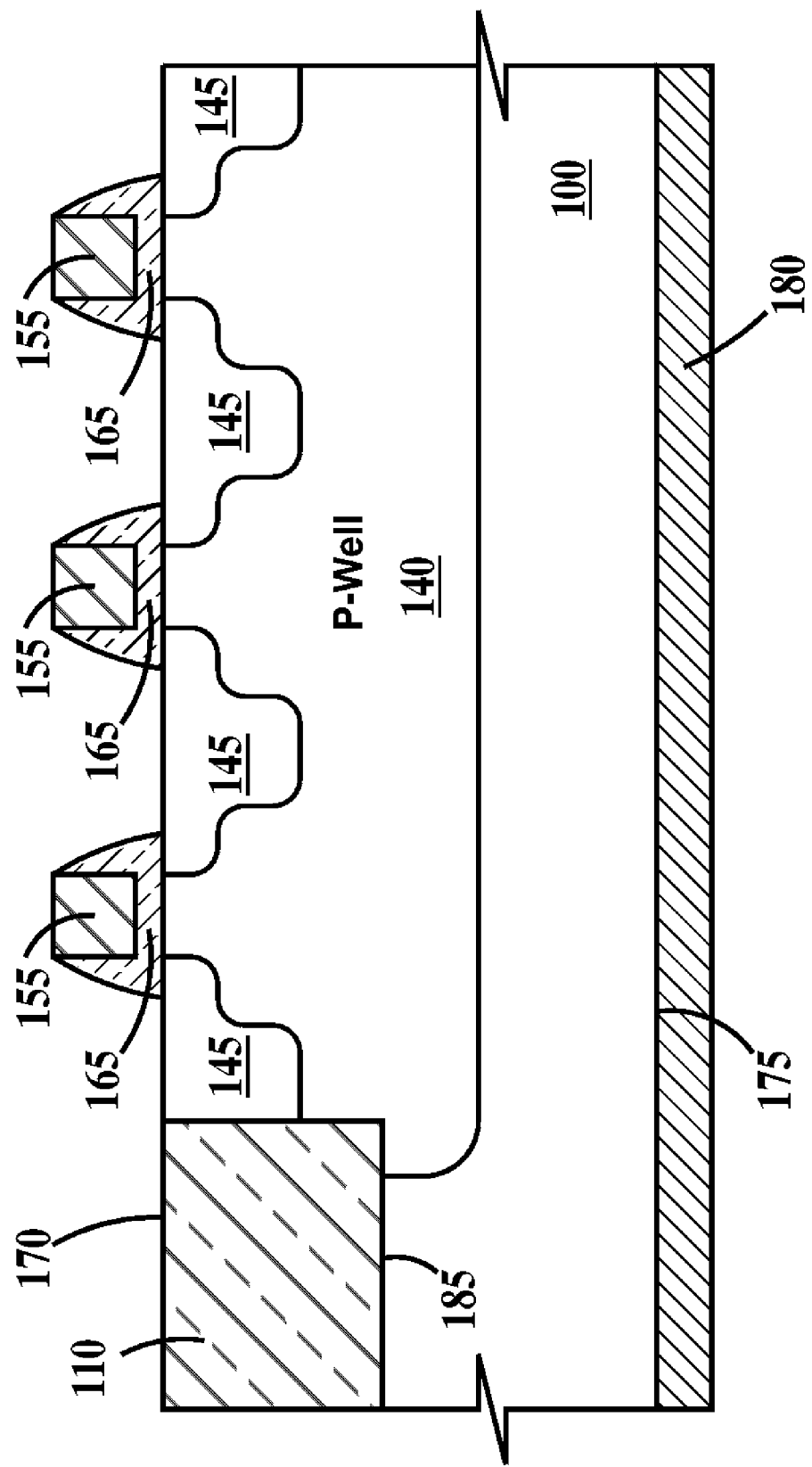
FIG. 2 is a cross-section through line 2-2 of FIG. 1.

FIG. 2 is a cross-section through line 2-2 of FIG. 1. In FIG. 2, source/drains 145 are separated by channel regions of P-well 140 under gate electrodes 155 and gate dielectric 165 intervenes between the gate electrodes 155 and these channel regions. A top surface of STI 110 is coplanar with a top surface 170 of substrate 100. P-well 140 abuts a bottom surface 185 of STI 110. Formed on a bottom surface 175 of substrate 100 is an optional electrically conductive layer 180. The structure of PFET array 115 is similar with P-well 140 being replaced with N-well 125 (see FIG. 1) and source/drains 145 being replaced with source/drains 130 (see FIG. 1).

Figure 3:
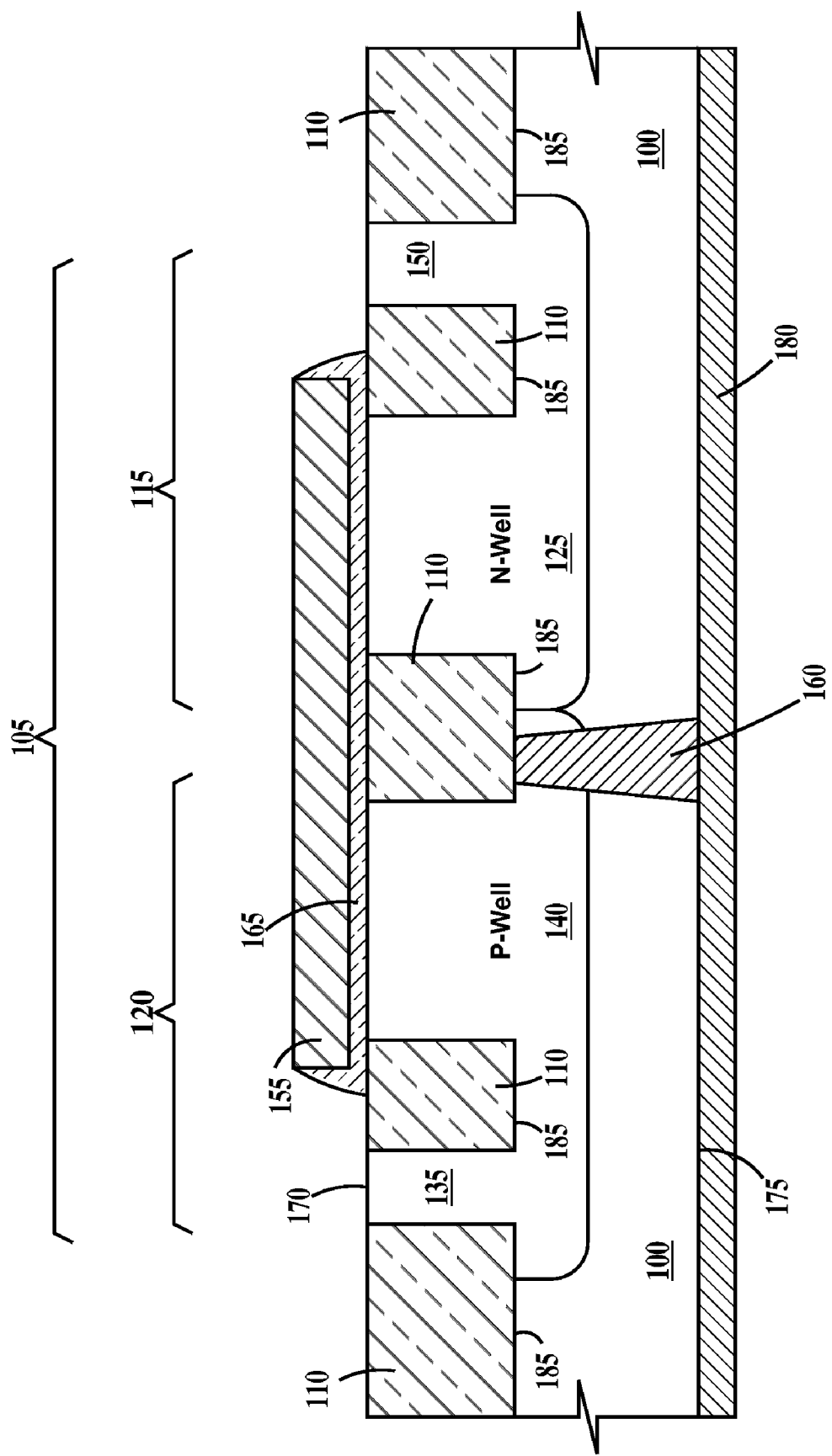
FIG. 3 is a cross-section through line 3-3 of FIG. 1.

FIG. 3 is a cross-section through line 3-3 of FIG. 1. In FIG. 3, through via 160 extends from bottom surface 180, through substrate 100, through P-well 140 to abut a bottom surface 185 of the region of STI 110 between PFET gate array 115 and NFET gate array 120. Either an electrically conductive contact, which may be ohmic (e.g., having resistance of about 1 ohm or less) or a Schottky diode is formed at the interface of through vias 160 and P-Well 140. Conductive layer 180 provides a low-resistance contact to through via 160. Through via 160 prevents latchup by preventing formation of a parasitic lateral PNPN device comprising source/drains 130 and 145 (see FIGS. 1 and 2) P-well 140 and N-well 125. Through via 160 eliminates the regenerative feedback between the PNP and NPN portions of the PNPN device through substrate 100. In FIG. 3, through via 160 does not touch N-well 125.

In one example, through via 160 comprises doped polysilicon, one or more refractory metals examples of which include tungsten, titanium and tantalum, or combinations thereof. In one example, conductive layer 180 comprises doped polysilicon, aluminum, platinum, nickel, cobalt, a metal silicide, one or more refractory metals examples of which include tungsten, titanium and tantalum, or combinations thereof.

It should be understood, that substrate 100 may be P or N-type and through 160 may formed through N-well 125 instead of P-Well 140 (see FIG. 3).

Thus, the embodiments of the present invention provide more robust latchup preventive structures and methods for preventing latchup for gate arrays in integrated circuit chips.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a P-well and an N-well formed in a semiconductor substrate, said P-well extending from a top surface of said substrate into said substrate a first distance, said N-well extending from said top surface of said substrate into said substrate a second distance;
   dielectric isolation extending from said top surface of said substrate into said substrate a third distance, said first, second and third distances less than a whole distance between said top and bottom surfaces of said substrate, said first and second distances greater than said third distances, said P-well abutting a bottom surface of said dielectric isolation and said N-well abutting said bottom surface of said dielectric isolation where said dielectric isolation extends into said N-well and said P-well;
   an array of spaced apart first gate electrodes positioned over said P-well, a first set of source/drains formed in said P-well between said first gate electrodes;
   an array of spaced apart second gate electrodes positioned over said N-well, a set of second source/drains formed in said N-well between said second gate electrodes; and
   an electrically conductive through via extending from said bottom surface of said substrate into said substrate a fourth distance, said fourth distance less than said whole distance, said through via contacting said P-well and abutting said bottom surface of shallow trench isolation that extends into said P-well.

2. The structure of claim 1, wherein an interface between said through via and said P-well forms (i) an electrically conductive contact, (ii) an ohmic contact or (iii) a Schottky diode.

3. The structure of claim 1, wherein:
   said through via contacts said P-well and abuts said bottom surface of shallow trench isolation in said P-well; and
   said through via does not contacts said N-well and does not abut said bottom surface of shallow trench isolation in said N-well.

4. The structure of claim 1, wherein:
   said through via contacts said P-well and abuts said bottom surface of shallow trench isolation in said P-well; and
   said through via contacts said N-well and abuts said bottom surface of shallow trench isolation in said N-well.

5. The structure of claim 1, further including:
   an electrically conductive layer on said bottom surface of said substrate, said conductive layer in electrical and physical contact with said through via.

6. The structure of claim 1, wherein:
   said through via comprises doped polysilicon, a refractory metal, tungsten, titanium, tantalum or combinations thereof; and
   said conductive layer comprises doped polysilicon, a refractory metal, tungsten, titanium, tantalum, aluminum, platinum, nickel, cobalt, a metal silicide or combinations thereof.

7. The structure of claim 1, wherein said first gate electrodes are integrally formed with said second gate electrodes.

8. A method, comprising:
   forming a P-well and an N-well in a semiconductor substrate, said P-well extending from a top surface of said substrate into said substrate a first distance, said N-well extending from said top surface of said substrate into said substrate a second distance;
   forming dielectric isolation in said substrate, said dielectric isolation extending from said top surface of said substrate into said substrate a third distance, said first, second and third distances less than a whole distance between said top and bottom surfaces of said substrate, said first and second distances greater than said third distances, said P-well abutting a bottom surface of said dielectric isolation and said N-well abutting said bottom surface of said dielectric isolation where said dielectric isolation extends into said N-well and said P-well;
   forming an array of spaced apart first gate electrodes positioned over said P-well, a first set of source/drains formed in said P-well between said first gate electrodes;
   forming an array of spaced apart second gate electrodes positioned over said N-well, a set of second source/drains formed in said N-well between said second gate electrodes; and
   forming an electrically conductive through via extending from said bottom surface of said substrate into said substrate a fourth distance, said fourth distance less than said whole distance, said through via contacting said P-well and abutting said bottom surface of shallow trench isolation that extends into said P-well.

9. The method of claim 8, wherein an interface between said through via and said P-well forms (i) an electrically conductive contact, (ii) an ohmic contact or (iii) a Schottky diode.

10. The method of claim 8, wherein:
    said through via contacts said P-well and abuts said bottom surface of shallow trench isolation in said P-well; and said through via does not contacts said N-well and does not abut said bottom surface of shallow trench isolation in said N-well.

11. The method of claim 8, wherein:

said through via contacts said P-well and abuts said bottom surface of shallow trench isolation in said P-well; and said through via contacts said N-well and abuts said bottom surface of shallow trench isolation in said N-well.

12. The method of claim 8, further including:

forming an electrically conductive layer on said bottom surface of said substrate, said conductive layer in electrical and physical contact with said through via.

13. The method of claim 8, wherein:

said through via comprises doped polysilicon, a refractory metal, tungsten, titanium, tantalum or combinations thereof; and said conductive layer comprises doped polysilicon, a refractory metal, tungsten, titanium, tantalum, aluminum, platinum, nickel, cobalt, a metal silicide or combinations thereof.

14. The method of claim 8, wherein said first gate electrodes are integrally formed with said second gate electrodes.

* * * * *